United States Patent
Ueda et al.

(10) Patent No.: US 8,419,905 B2
(45) Date of Patent: Apr. 16, 2013

(54) METHOD FOR FORMING A DIAMOND-LIKE CARBON LAYER ON AIR BEARING SURFACE OF A SLIDER

(75) Inventors: Kunihiro Ueda, Hong Kong (CN); Hongxin Fang, DongGuan (CN); Dong Wang, DongGuan (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 586 days.

(21) Appl. No.: 12/656,196

(22) Filed: Jan. 20, 2010

(65) Prior Publication Data
US 2011/0174608 A1   Jul. 21, 2011

(51) Int. Cl.
*C23C 14/00* (2006.01)

(52) U.S. Cl.
USPC .............. 204/192.1; 204/192.16; 204/192.32; 204/192.34; 204/192.3; 204/192.38; 427/255.28; 427/532; 427/533; 427/534

(58) Field of Classification Search .............. 204/192.1, 204/192.12, 192.32, 192.34, 192.16, 192.3, 204/192.38; 427/255.28, 532, 533, 534
See application file for complete search history.

(56) References Cited

U.S. PATENT DOCUMENTS

| | | | | |
|---|---|---|---|---|
| 5,903,416 | A * | 5/1999 | Chung | 360/122 |
| 6,330,131 | B1 * | 12/2001 | Nepela et al. | 360/234.5 |
| 7,886,423 | B2 * | 2/2011 | Fang et al. | 29/603.12 |

FOREIGN PATENT DOCUMENTS

JP   07090553 A  *  4/1995

OTHER PUBLICATIONS

Translation to Miyake (JP 07-090553) published Apr. 1995.*

* cited by examiner

*Primary Examiner* — Keith Hendricks
*Assistant Examiner* — John Brayton
(74) *Attorney, Agent, or Firm* — Nixon & Vanderhye PC (57) ABSTRACT

A method for forming a diamond-like carbon (DLC) layer on air bearing surface (ABS) of a slider, comprises steps of: providing sliders arranged in arrays, each slider having an ABS; forming a mixing layer in the ABS of the slider by depositing a first DLC layer on the ABS, the mixing layer consisting of the slider material and the first DLC layer material; removing the first DLC layer to make the mixing layer exposed; forming a second DLC layer on the mixing layer.

11 Claims, 9 Drawing Sheets

(Prior Art)

METHOD FOR FORMING A DIAMOND-LIKE CARBON LAYER ON AIR BEARING SURFACE OF A SLIDER

FIELD OF THE INVENTION

The present invention relates to a method for manufacturing an information storage device and more particularly, the invention relates to a method for forming a diamond-like carbon (DLC) layer on an air bearing surface (ABS) of a slider of the information storage disk device.

BACKGROUND OF THE INVENTION

Figure 1A:
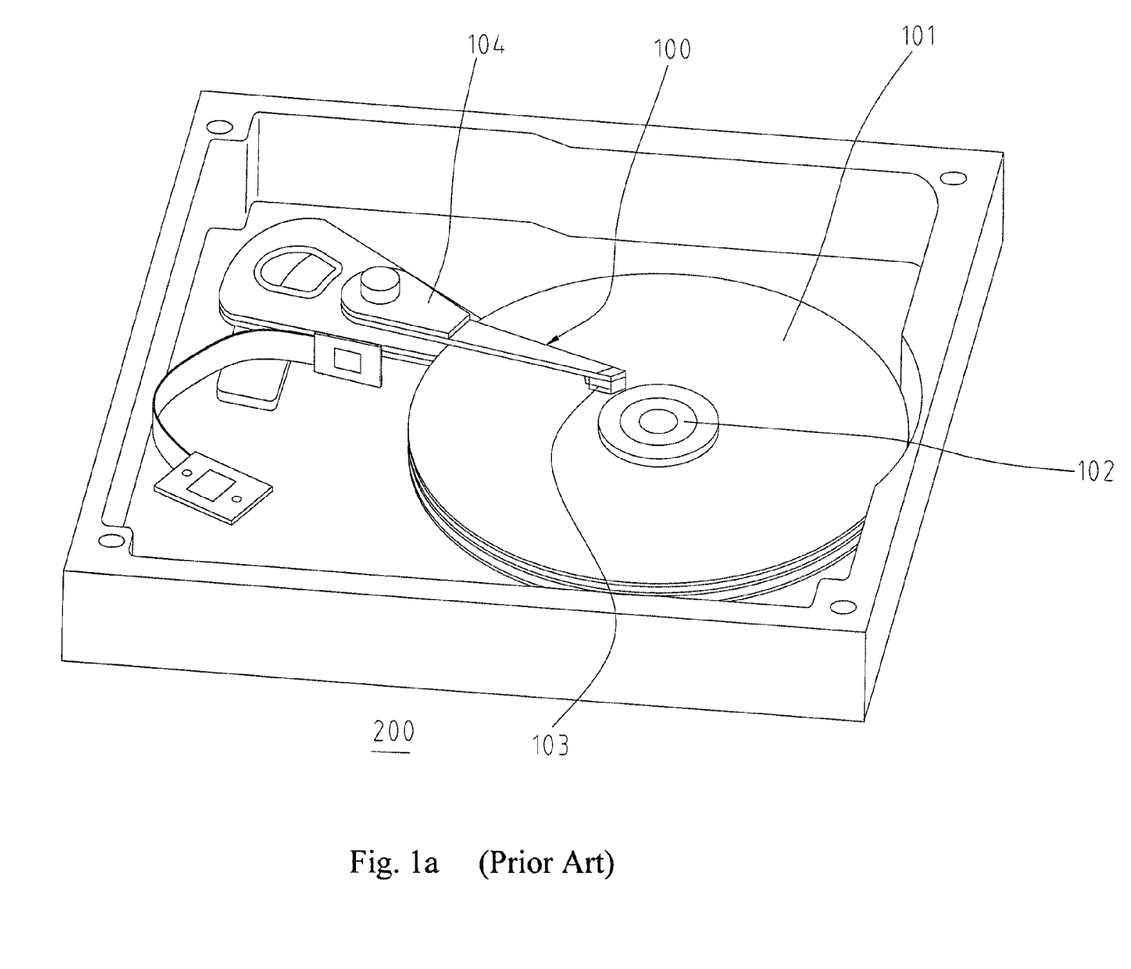
FIG. 1a is a perspective view of a typical disk drive device used in related industry.

One known type of information storage device is a disk drive device. FIG. 1a illustrates a conventional disk drive device 200 and shows a magnetic disk 101 mounted on a spindle motor 102 for spinning the disk 101. A voice coil motor arm 104 carries a head gimbal assembly (HGA) 100 that includes a slider 103 incorporating a read/write head. A voice-coil motor is provided for controlling the motion of the motor arm 104 and, in turn, controlling the slider 103 to move from track to track across the surface of the disk 101, thereby enabling the read/write head to read data from or write data to the disk 101. In operation, a lift force is generated by the aerodynamic interaction between the slider 103 and the spinning magnetic disk 101. The lift force is counterbalanced by spring forces applied by a suspension of the HGA 100 such that a predetermined flying height above the surface of the spinning disk 101 is maintained over a full radial stroke of the motor arm 104.

Figure 1B:
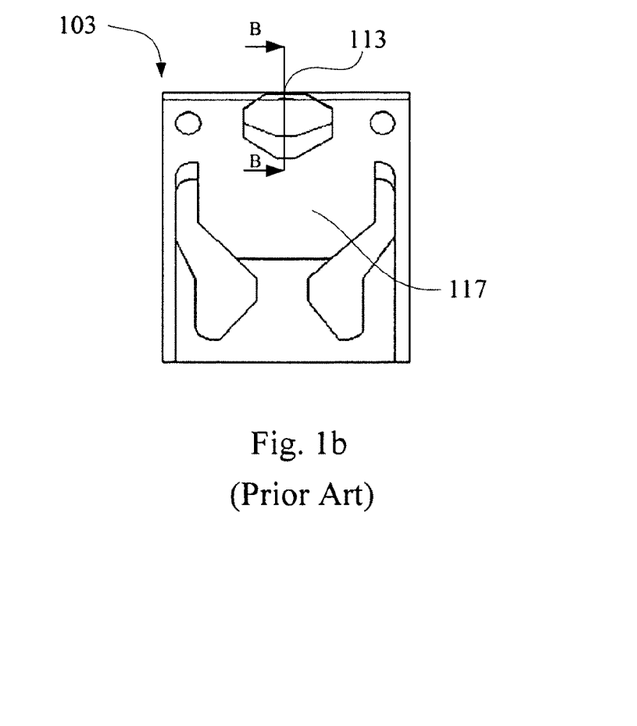

FIG. 1b shows a bottom plan view of a slider of the disk drive device 200 shown in FIG. 1a. The slider 103 has an air bearing surface (ABS) 117 formed thereon for generating an aerodynamic interaction between the slider 103 and the spinning disk 101 (refer to FIG. 1a) during operation of the disk drive device, thus making the slider 103 flying over the disk 101. The slider 103 further provides a pole tip 113 having a reading/writing head thereon to realize data reading/writing operation with respect to the disk 101.

Figure 1C:
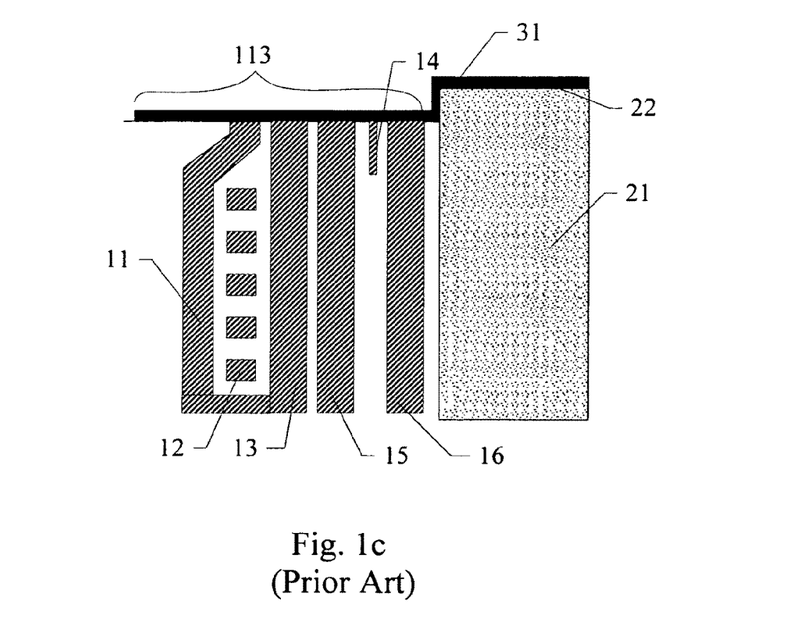
FIG. 1c is a partial cross-sectional view of the slider shown in FIG. 1b along line B-B, illustrating detailed structure of a pole tip of the slider.

FIG. 1c shows a detailed structure of the pole tip 113 of the slider 103. As shown in the figure, the pole tip 113 comprises from left to right second a second inductive write head pole 11, a first inductive write head pole 13 spacing away from the second inductive write head pole 11, a second shielding layer 15 and a first shielding layer 16. The components are carried on a ceramic substrate 21 that constitutes main body of the slider 103. A magneto-resistive element (MR element) 14 is provided between the second shielding layer 15 and first shielding layer 16. In addition, copper coils 12 are provided between the first inductive write head pole 13 and the second inductive write head pole 11 for assisting in writing operation. In addition, an overcoat 31 is covered on the ABS to protect the slider 103.

On one hand, since the ABS especially the pole tip region (mainly made of metal material, for example the copper coils 12 described above) of a slider is susceptible to damage caused by chemical corrosion resulting from environment moisture, a protect layer (such as the overcoat 31 described above) is necessary to be coated on the whole ABS of the slider. For this purpose, carbon material such as diamond-like carbon (DLC) that has strong corrosion-resist ability is often utilized as a protector layer. In addition, it is expected that adhesion ability of the DLC layer with respect to the ABS is as strong as possible so that the DLC layer will not be easily peeled off from the ABS. On the other hand, it is desired to reduce thickness of the DLC layer covered on the ABS so as to further reduce the flying height of the slider (the distance between the disk and the ABS of the slider), thus making it possible to further improve storage capacity of a disk drive device. Various methods for coating a DLC layer are available currently; however, all these methods fail to meet both requirements, i.e., strong adhesion ability and small thickness. These methods are described below.

Figure 2:
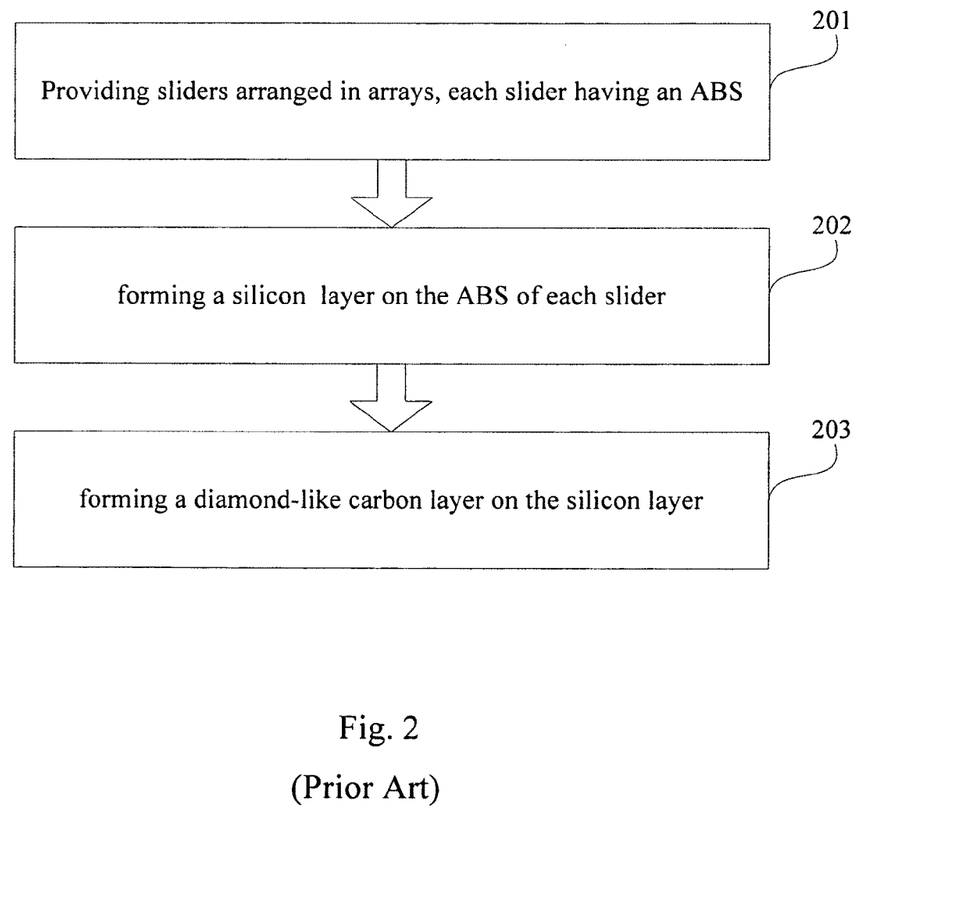
FIG. 2 shows a flowchart illustrating a conventional method for forming a diamond-like carbon (DLC) layer on air bearing surface (ABS) of a slider.

FIG. 2 illustrates such a conventional method. The method comprises the steps of: firstly, providing sliders arranged in arrays, each slider comprising an ABS (step 201); then, forming a silicon layer on the ABS of each slider (step 202); finally, forming a DLC layer on the silicon layer (step 203). Due to natural properties of DLC, it is difficult to directly deposit the DLC on the ABS, especially on the pole tip thereof with sufficient adhesion force; as a result, for improving adhesion ability, a silicon layer, which helps enhance adhesion ability of the DLC layer on the ABS, is coated on the ABS before coating of the DLC layer, and then, the DLC layer is coated on the silicon layer.

Though the DLC layer coated by above method is stable in adhesion ability, however, as two layers of different materials, but not only one layer of material are coated altogether, it is difficult to further reduce total thickness of the silicon layer and the DLC layer, because further reduction in thickness of either the silicon layer or DLC layer will cause respective layer to be discontinuous in coverage, thus increasing likelihood of the DLC layer being peeled off from the ABS. This discontinuity coverage of the layer can be checked and evaluated using acid dipping method. In the method the corrosion dots on the discontinuous layer caused by acid corrosion are found under a high magnification microscope.

Another method for forming a DLC layer on ABS of a slider is directly coating a DLC layer on the ABS of a slider. In the method, only a single DLC layer but not the combination of a silicon layer and a DLC layer is deposited on the ABS, thereby little even no problem of discontinuity in thickness of a single material layer exists, thus the total thickness of the DLC layer capable of being further reduced such that the flying height of the slider can be further reduced. However, this method is impracticable. Such coated DLC layer will be easily delaminated from the ABS after some kind of tests, because as discussed above, the adhesion of the DLC layer to the slider ABS, especially on the pole tip region is weak.

Thus, there is a need for an improved DLC coating method that does not suffer from the above-mentioned drawbacks.

SUMMARY OF THE INVENTION

One aspect of the invention is to provide a method for forming a DLC layer on ABS of a slider, which can improve adhesion ability of the DLC layer to the ABS of the slider.

Another aspect of the invention is to provide a method for forming a DLC layer on ABS of a slider, which can effectively reduce the entire thickness of the DLC layer.

To achieve above objects, a method for forming a diamond-like carbon (DLC) layer on air bearing surface (ABS) of a slider is provided which comprises steps of: (1) providing sliders arranged in arrays, each slider having an ABS; (2) forming a mixing layer in the ABS of the slider by depositing a first DLC layer on the ABS, the mixing layer consisting of the slider material and the first DLC layer material; (3) removing the first DLC layer to make the mixing layer exposed; (4) forming a second DLC layer on the mixing layer.

In an embodiment, the method may further comprise steps of: putting the sliders on a tray; loading the tray into a processing chamber; and then evacuating the processing chamber to a preset pressure and these steps are performed after the step (1) and before the step (2). After the processing chamber is evacuated and before the step (2), a step of removing contamination accumulated on the ABS of the slider is performed. In addition, the contamination aforementioned may be removed by any suitable method for example ion-beam etching or plasma sputtering method.

The first DLC layer may be deposited on the ABS of each slider by chemical vapor deposition, ion beam deposition or filtered cathodic arc method. The step (3) of the method is performed by ion-beam etching method, and the incidence angle of the ion-beam is ranged from 0-80 degrees, and the etching energy ranges from 150-500 eV.

The second DLC layer may be formed on the mixing layer by chemical vapor deposition, ion beam deposition or filtered cathodic arc method. Preferably, the thickness of the second DLC layer is from 1.5 nm to 3.0 nm so as to provide strong yet sufficiently thin protect layer on the ABS of a slider.

Alternatively, a step of venting the processing chamber and unloading the sliders from the processing chamber may be implemented; and the step may be performed after the step (4).

On one hand, as only a single DLC layer (the second DLC layer) is covered on the ABS of a slider, the protect layer of the ABS is able to be reduced in thickness while without thickness discontinuity concerns which exists in a conventional method; on the other hand, as a mixing layer, which contains both the DLC material and the slider material, and which has strong adhesion to both the ABS and the DLC material, is formed in the ABS, the subsequent coated DLC material (the second DLC layer) can obtain good adhesion to the ABS.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 1b is a bottom plan view of a slider of the disk drive device shown in FIG. 1a;

DETAILED DESCRIPTION OF ILLUSTRATED EMBODIMENTS

Various preferred embodiments of the present invention will now be described with reference to the figures. The invention provides a method for forming a DLC layer on ABS of a slider, which comprises steps of: providing sliders arranged in arrays, each slider having an ABS; forming a mixing layer in the ABS of the slider by depositing a first DLC layer on the ABS, the mixing layer consisting of the slider material and the first DLC layer material; removing the first DLC layer to make the mixing layer exposed; and finally forming a second DLC layer on the mixing layer. As the mixing layer has good adhesion ability with both the ABS and the second DLC layer, the second DLC layer thus coated can obtain good adhesion ability; in addition, since only a single material, i.e., DLC material serving as a protector layer is coated on the ABS, the total thickness of the protector layer is effectively reduced.

Figure 3:
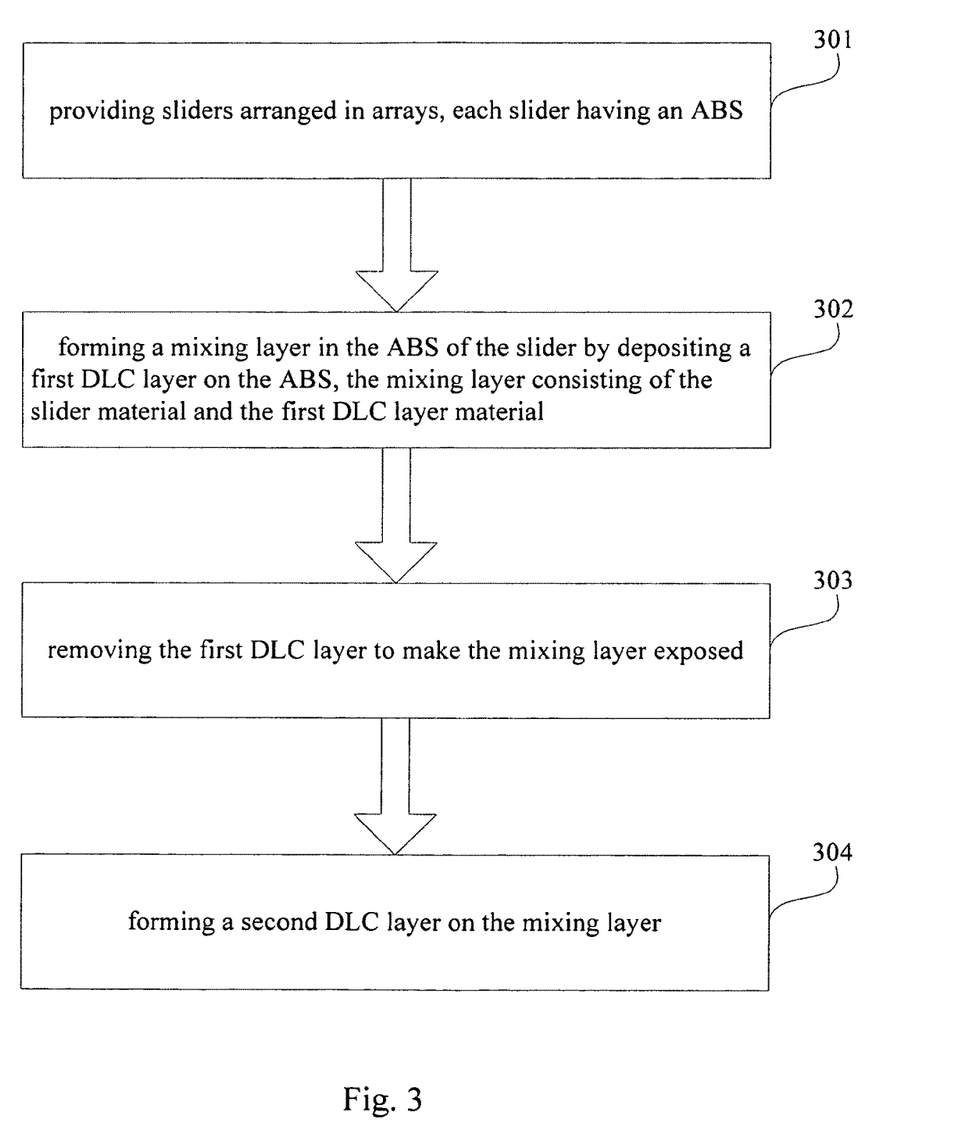
FIG. 3 shows a flowchart illustrating a method for forming a DLC layer on ABS of a slider according to an embodiment of the invention.

FIG. 3 illustrates a method of forming a DLC layer on ABS of a slider according to an embodiment of the invention. As illustrated, the method comprises steps of: firstly, providing sliders arranged in arrays, each slider having an air bearing surface (ABS) (step 301); then, forming a mixing layer in the ABS of the slider by depositing a first DLC layer on the ABS, the mixing layer consisting of the slider material and the first DLC layer material (step 302); after that, removing the first DLC layer to make the mixing layer exposed (step 303); finally, forming a second DLC layer on the mixing layer (step 304).

Figure 4:
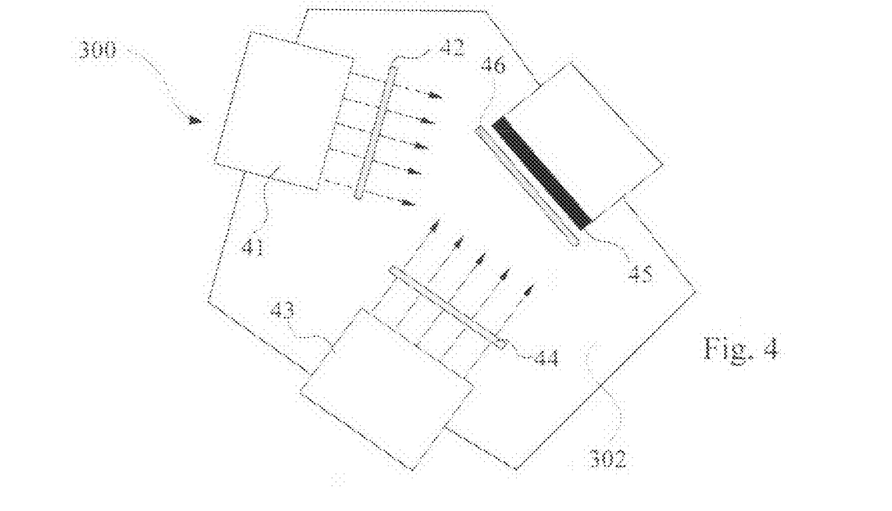
FIG. 4 schematically shows a machinery system used to implement the main steps of the method shown in FIG. 3.

The above method of the invention may be performed by a device 300 shown in FIG. 4 and therefore, the method is described in great detail in conjunction with the figure. More specifically, in the step 301, the sliders arranged in arrays are also referred as to a slider row bar. The slider row bar is originally cut from a wafer. The slider row bar is handled properly to form ABS on one surface thereof, and after that, the slider row bar is cleaned by suitable solvent and finally dried by IPA vapor. The cleaned and dried slider row bar is ready for DLC coating process.

Then, the slider row bar (denoted with numeral 45 in FIG. 4) is placed on a tray (not labeled). Next, the tray is loaded in a processing chamber 302 of a device 300. After that, the processing chamber 302 is evacuated to a predetermined pressure.

Next, a pre-cleaning process is performed to get rid of the contamination accumulated on the ABS of the slider. Normally the ABS absorbs some moisture, carbon dioxide and even some organic solvent, which is used to clean the ABS in atmosphere, and these substances constitute contamination. Accordingly, the pre-cleaning process is used to remove the contamination. Here, the pre-cleaning is performed by ion-beam etching (IBE) method. More specifically, as shown in FIG. 4, when performing the pre-cleaning process, a first shutter 42 and a second shutter 46 is open and ion beam generated by an ion-beam etching source (IBES) 41 bombards the ABS of the slider row bar 45 such that the contamination is removed by etching process.

As the pre-cleaning process is aimed to eliminate surface contamination, thus physical removal of material of the ABS (namely, substrate of the slider) is very small, and usually is about 1 nm. It is noted that though the contamination in this embodiment is removed by IBE method, however, it can also be removed by other suitable method such as plasma sputtering method.

After the pre-cleaning process, a first DLC layer is deposited on the ABS of the slider row bar 45 by ion-beam deposition (IBD) method. Namely, after the pre-cleaning process, the first shutter 42 is closed and a third shutter 44 is open. Carbon ion beam generated by an ion-beam deposition source 43 is deposited on the ABS of the slider row bar 45. After a period of time elapses, a first DLC layer is deposited on the ABS. In this process, methane or ethylene may be used as precursor for IBD process, while pure graphite cylinder may be used as filtered cathodic arc (FCA) target. The graphite target is ionized by arcing and then, the ionized carbon particles, i.e., carbon ions are confined by a magnetic duct. When passing through the magnetic duct, big particles are filtered. Only very fine carbon ions are deposited on the ABS of the slider row bar 45. Normally, the first DLC layer such formed has a thickness of 1-2 nm. Notably, during deposition of the first DLC layer, part carbon material is implanted into the ABS such that a mixing layer that contains material of the first DLC layer and material of the slider is formed in the ABS.

It is noted though in this embodiment, the first DLC layer is formed by IBD method, however, other methods for example chemical vapor deposition (CVD) or filtered cathodic arc (FCA) method may also be used to form the first DLC layer. Furthermore, in the mixing layer forming process (deposition process of the first DLC layer), it is important to control parameters of the ion beam for getting a suitable depth of mixing layer, and it is proved by experiment that when the incidence angle of the ion beam is within 0-80 degrees, the etching energy ranges in 150-500 eV, the mixing layer will have an optimum depth, which leads to good adhesion ability with a second DLC layer that will be coated thereon in a next step.

Thereafter, the first DLC layer is etched off such that the mixing layer is exposed out from the ABS. In this time, the third shutter 44 is closed, and again, the first shutter 42 is open such that the ion beam generated in the IBES 41 bombards (namely, etches off) the first DLC layer deposited on the ABS to remove the first DLC layer and the mixing layer is thus exposed.

During process of exposing the mixing layer out from the ABS, for precisely controlling etching volume of the first DLC layer so as not to damage the mixing layer, an end point detecting system is applied in the etching process. The system uses a mass spectrum to determine substrate material (usually containing Titanium, Alumina and Nickel Ferrite). Once the system finds that the substrate material (main material of a slider) is sputtered, the etching process will be stopped immediately.

After exposure of the mixing layer, a second DLC layer is then deposited thereon. Also referring to FIG. 4, the first shutter 42 is closed once again and accordingly the third shutter 44 is open again. The carbon ion beam generated in the IBDS 43 is deposited on the mixing layer to form a second DLC layer thereon. It is noted that though the second DLC layer in this embodiment is formed by IBD method, however, it can also be formed by other methods for example CVD or FCA method. In addition, it is preferred that the second DLC layer has a thickness of 1.5-3.0 nm so as to provide sufficient protect function to the ABS of the slider row bar 45.

Finally, the processing chamber 302 may be vented and the slider row bar 45 with the second DLC layer covered on its ABS may be unloaded from the processing chamber 302 to end the whole process.

Figure 5A:
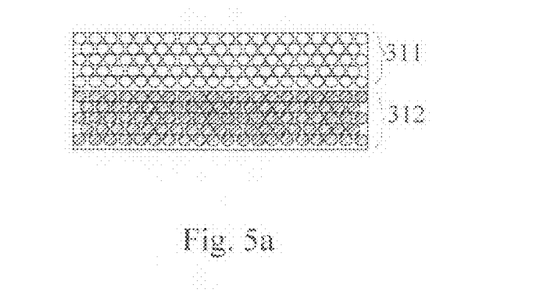
FIGS. 5a-5c are sequential views for illustrating the main steps of the method shown in FIG. 3.
Figure 5B:
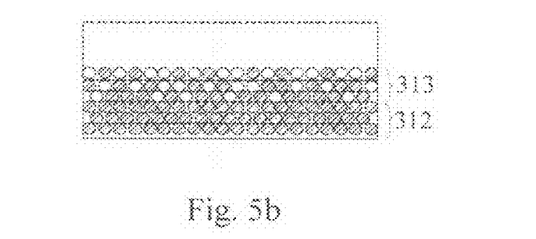
Figure 5C:
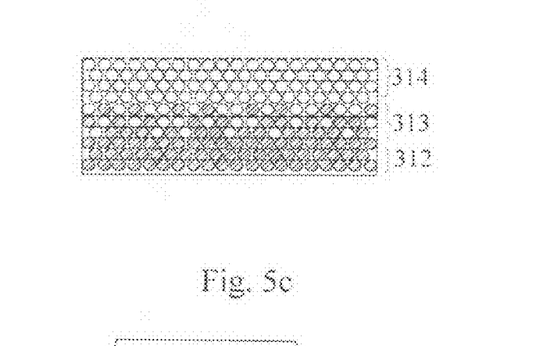

FIGS. 5a-5c show main surface changes of the ABS when performing the method of the invention shown in FIG. 3. In the figures, numeral 311 represents a first DLC layer, numeral 312 represents an ABS of a slider row bar, numeral 313 represents a mixing layer, and numeral 314 represents a second DLC layer. As shown in FIG. 5a, the first DLC layer 311 is coated on the ABS 312 during the first DLC layer forming process such that a mixing layer 313 is formed in the ABS 312 (refer to FIG. 5b). Then, the first DLC layer is etched off such that the mixing layer 313, which contains both materials of the first DLC layer 311 and the ABS 312 (i.e., substrate), is exposed, as shown in FIG. 5b. Finally, as shown in FIG. 5c, the second DLC layer 314 serving as a protector layer is coated on the mixing layer 313 to protect the whole ABS 312.

Figure 6:
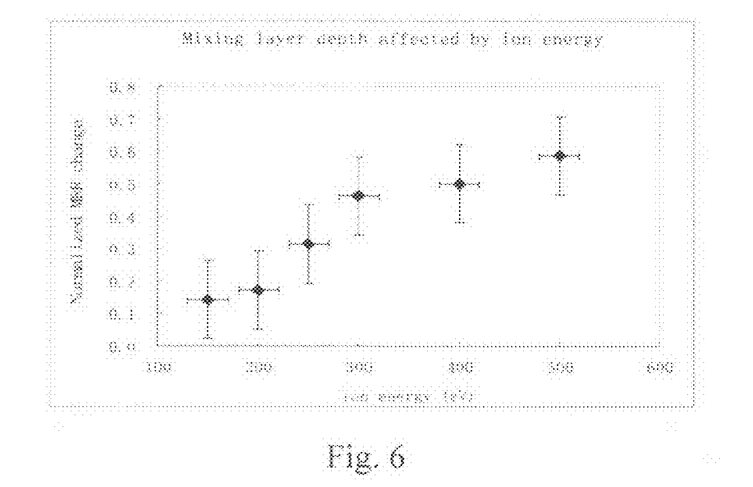
FIG. 6 shows a diagram illustrating influence of ion beam energy of ion beam etching (IBE) on depth of a mixing layer during etching process.

In foregoing method, during the mixing layer forming process, ion energy has great influence on depth of the mixing layer. Generally, since MRR (magneto-resistive resistance) change of a slider is proportional to depth change of the mixing layer, thus the depth change may be obtained by observing MRR change, and this MRR change against the ion energy is demonstrated in FIG. 6, in which the MRR change is normalized value. It is clear from the figure that when ion energy increases, the MRR change increases too, that is, the depth of the mixing layer increases too. For achieving a proper depth of mixing layer, it is needed to control the ion energy, and it is proved that energy of 150-500 eV is preferred.

Figure 8A:
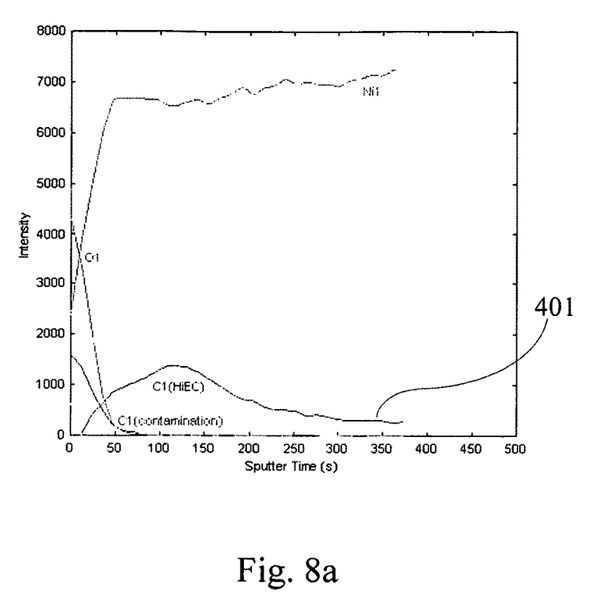
FIG. 8a shows a diagram illustrating Auger depth profile analysis result of a wafer surface containing a mixing layer consisting of DLC material and NiFe material.
Figure 8B:
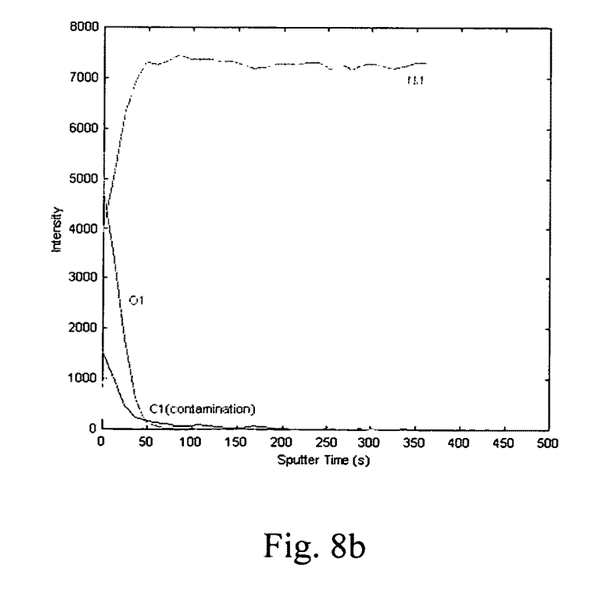
FIG. 8b shows another diagram illustrating Auger depth profile analysis result of a wafer surface without a mixing layer formed thereon.

The mixing layer thus formed may be detected using Auger Electron Spectrum (AES) method. More specifically, a NiFe (82% of Ni) wafer is used as a benchmark in AES depth profile analysis. The wafer is etched by IBD, and then coated with a 2 nm thick silicon layer. FIG. 8b shows an AES depth profile analysis result of the wafer. As a comparison, a second wafer (containing the same content of chemical elements as the above wafer) is also etched by IBD, and then coated with a DLC layer. Next, the DLC layer is etched off and a silicon layer of 2 nm is coated on the second wafer again. FIG. 8a shows an AES depth profile analysis result of the second wafer. As compared, an additional intensity curve 401 is present in the diagram shown in FIG. 8a. The intensity curve 401 represents intensity change of carbon element (high energy carbon, HiEC), and the presence of the curve 401 means that a mixing layer containing carbon is actually formed on the second wafer.

Figure 7:
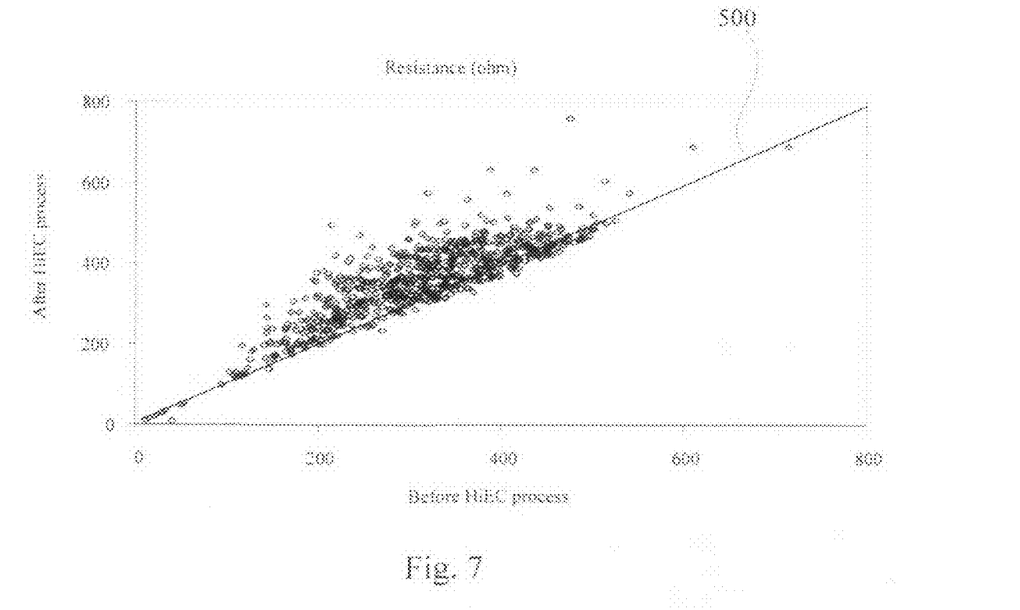
FIG. 7 shows a diagram illustrating MRR change of a slider before and after process of the invention.

In addition, during implementation of the method of the invention, ESD (electrostatic damage) may cause destructive effect to pole tip of a slider. For evaluating this destructive effect, a TMR (tunnel magneto-resistive) slider is used as a sample. Here, a criterion for ESD is to check MRR drop of the slider before and after performing of the method (concretely, the step of forming the second DLC layer, i.e., HiEC process). If the MRR drop is lager than 95%, then a barrier layer of the TMR slider is thought to be broken down by ESD. The MRR drop is demonstrated in FIG. 7. It can be seen that most testing points are located above diagonal line 500, and only a few of testing points are below the diagonal line 500, meaning that MRR drop (testing points below the diagonal line 500) is small. In other word, the method of the invention causes little ESD damage to the slider.

Furthermore, for evaluating adhesion ability and coverage improvement of the DLC layer covered on an ABS of a slider, a thermal shock test and an acid dipping test are performed herein. Now the tests are described. Firstly, a group of slider is taken as samples. Each slider is covered with a DLC layer on its ABS. The DLC layers with thickness of 1 nm, 1.5 nm, 2 nm, 2.5 nm; and 3 nm are formed by the method of the invention respectively, whereas the rest DLC layer with thickness of 3 nm and marked with 3C is formed by a conventional method, in which a silicon layer is necessary to improve adhesion of the DLC layer with the ABS of a slider.

Figure 9A:
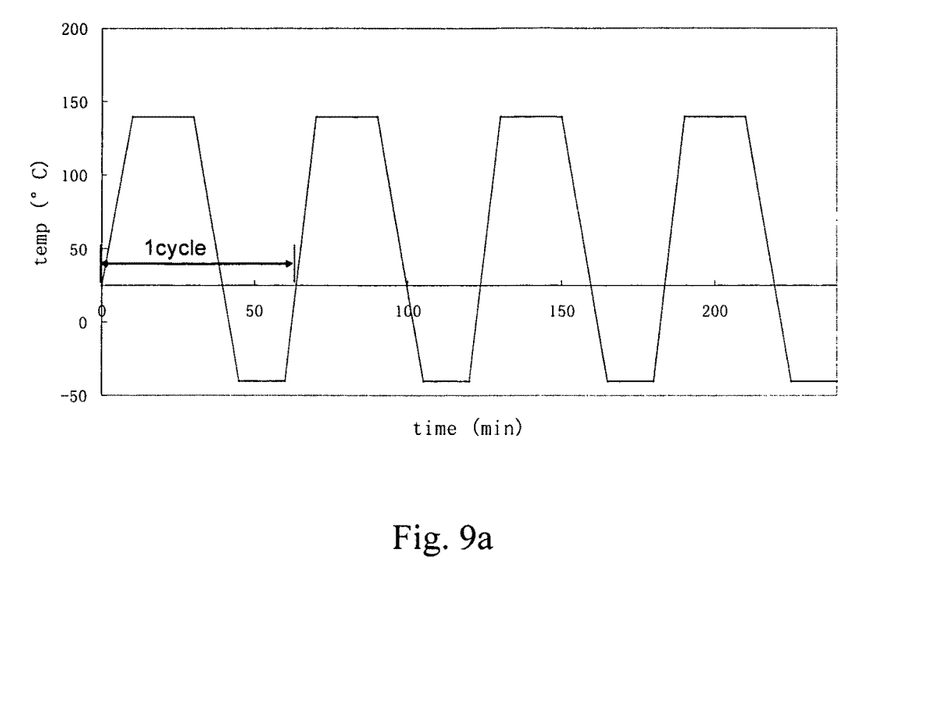
FIG. 9a shows a diagram illustrating temperature change of a thermal shock test against time.

Then, original defects of each slider on its pole tip region are checked under a microscope (1500×). Next, these sliders undergo a thermal shock test under temperature condition shown in FIG. 9a. Namely, the sliders are put in an environment in which temperature changes alternatively against time from a high temperature (140° C.) to a low temperature (40° C.) to test adhesion ability of the DLC layer with the ABS. The temperature changes in time cycles as shown in the figure. After that, the sliders are dipped into a specified acid (PH1.8) for a short time. By this short time acid dipping step, the ABS of respective slider especially the pole tip region thereof is corroded by the acid and the corrosion dots are counted under a microscope (1500×). After the short time dipping step, the sliders are put into another specified acid (PH1.8) for a long time. Similarly, by this long time acid dipping step, much more corrosion dots are formed on the ABS of respective slider, and are counted accordingly under a microscope (1500×). The final test results are demonstrated in FIGS. 9b-9c, in which ordinate represents failure rate (namely, increment rate of the corrosion dots relative to the original defects), while abscissa represents sliders with different thickness of DLC layers. In addition, in the drawings, hatched blocks represent serious failure rate, while blank blocks represent slight failure rate.

Figure 9B:
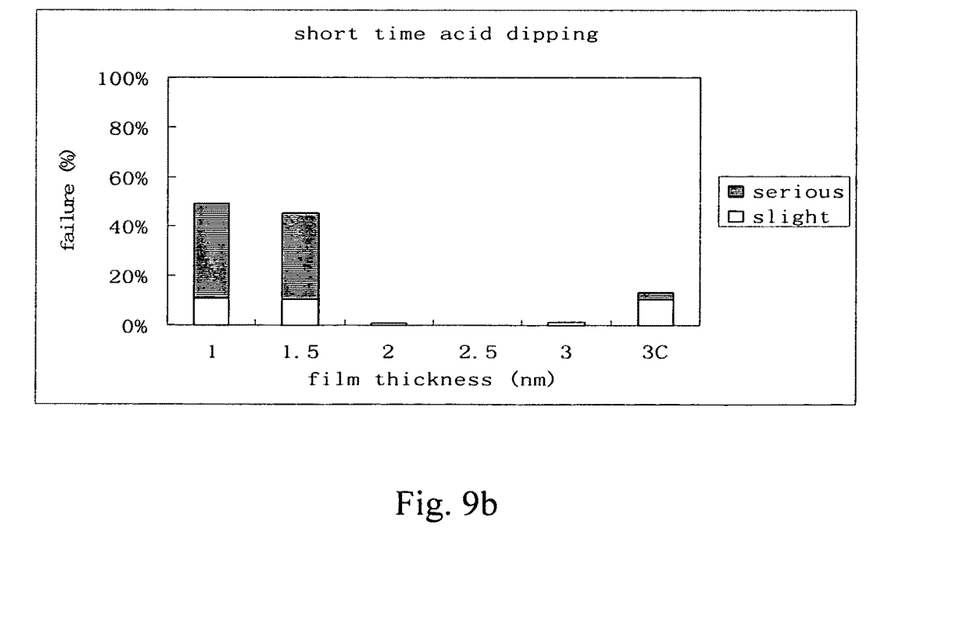
FIG. 9b shows a diagram illustrating surface corrosion results of a group of sliders after a short time acid dipping test.
Figure 9C:
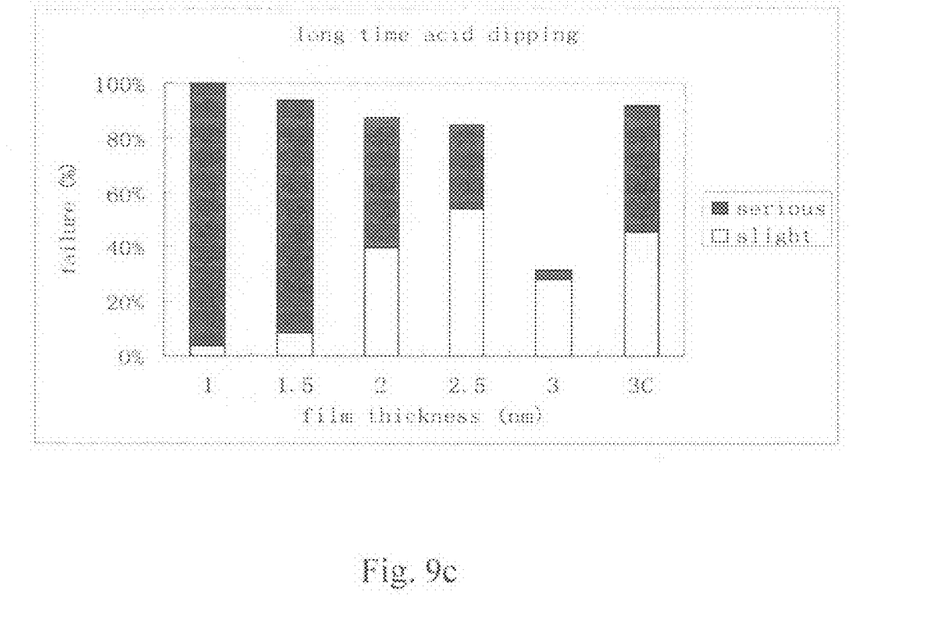
FIG. 9c shows a diagram illustrating surface corrosion results of a group of sliders after a long time acid dipping test.

FIG. 9b shows corrosion result after a short time acid dipping test. It is clear from the figure that the DLC layer of 2 nm thick coated on respective ABS of a slider by method of the invention bears extremely smaller failure rate than another DLC layer (the one marked with 3C) of 3 nm thick coated by the conventional method. Similarly, as shown in FIG. 9c, the same DLC layer of 2 nm thick bears a smaller failure rate than the DLC layer marked with 3C. In other word, the method of the invention is able to form a thinner yet more stable DLC layer on ABS of a slider than a conventional method.

Understandingly, though the method of the invention is implemented by a single device 300; it may also be implemented by two or more devices in sequence, in case where a single device capable of performing all the processes of the method is unavailable. For example, the processes before mixing layer forming process may be implemented by one device, while the mixing layer forming process and subsequent processes may be implemented by another device.

Compared with conventional methods, as the mixing layer formed in the ABS of a slider has good adhesion ability with both the ABS and the second DLC layer, the second DLC layer thus coated can obtain good adhesion ability; in addition, since only a single material, i.e., the second DLC layer serving as a protector layer is coated on the ABS, the total thickness of the protector layer is effectively reduced.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method for forming a diamond-like carbon layer on air bearing surface of a slider, the method comprising:
   (1) providing sliders arranged in arrays, each slider having an air bearing surface;
   (2) forming a mixing layer in the air bearing surface of the slider by depositing a first diamond-like carbon layer on the air bearing surface, the mixing layer consisting of the slider material and the first diamond-like carbon layer material;
   (3) removing the first diamond-like carbon layer to make the mixing layer exposed; and
   (4) forming a second diamond-like carbon layer on the mixing layer.

2. The method according to claim 1, further comprising:
   putting the sliders on a tray;
   loading the tray into a processing chamber; and then
   evacuating the processing chamber to a preset pressure, and these steps are performed after (1) and before (2).

3. The method according to claim 2, wherein after the processing chamber is evacuated and before (2), contamination accumulated on the air bearing surface of the slider is removed.

4. The method according to claim 3, wherein the contamination is removed by an ion-beam etching or plasma sputtering method.

5. The method according to claim 1, wherein the first diamond-like carbon layer is deposited on the air bearing surface of each slider by chemical vapor deposition, ion beam deposition or filtered cathodic arc method.

6. The method according to claim 1, wherein (3) is performed by an ion-beam etching method.

7. The method according to claim 6, wherein an incidence angle of the ion-beam is from 0-80 degrees.

8. The method according to claim 6, wherein the etching energy ranges from 150-500 eV.

9. The method according to claim 1, wherein the second diamond-like carbon layer is formed on the mixing layer by chemical vapor deposition, ion beam deposition, or a filtered cathodic arc method.

10. The method according to claim 1, wherein the thickness of the second diamond-like carbon layer is from 1.5 nm to 3.0 nm.

11. The method according to claim 2, further comprising, after (4), venting the processing chamber and then unloading the sliders from the processing chamber.

* * * * *